(12) United States Patent
Do

(10) Patent No.: US 7,068,547 B2
(45) Date of Patent: Jun. 27, 2006

(54) INTERNAL VOLTAGE GENERATING CIRCUIT IN SEMICONDUCTOR MEMORY DEVICE

(75) Inventor: Chang-Ho Do, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 10/792,065

(22) Filed: Mar. 2, 2004

(65) Prior Publication Data

US 2005/0141292 A1 Jun. 30, 2005

(30) Foreign Application Priority Data

Dec. 30, 2003 (KR) ...................... 10-2003-0099597

(51) Int. Cl.
*G11C 7/00* (2006.01)
(52) U.S. Cl. ................... 365/189.11; 365/203; 365/204
(58) Field of Classification Search ........... 365/189.11, 365/203, 204
See application file for complete search history.

(56) References Cited

U.S. PATENT DOCUMENTS

| 5,394,077 | A | * | 2/1995 | Atsumi ....................... 323/223 |
| 5,687,123 | A | * | 11/1997 | Hidaka et al. ......... 365/189.11 |
| 5,831,421 | A | | 11/1998 | Taira et al. |
| 6,021,082 | A | | 2/2000 | Shirai |
| 6,067,269 | A | | 5/2000 | Han et al. |
| 6,653,888 | B1 | | 11/2003 | Lee |
| 6,657,910 | B1 | | 12/2003 | Kondou |
| 6,677,801 | B1 | | 1/2004 | Shimomura |
| 6,683,445 | B1 | | 1/2004 | Park |
| 2002/0063594 | A1 | | 5/2002 | Lee |

FOREIGN PATENT DOCUMENTS

| JP | 05-336736 | 12/1993 |
| JP | 08-307225 | 11/1996 |
| JP | 09-007370 | 1/1997 |
| JP | 10-125097 | 5/1998 |
| JP | 11-149774 | 6/1999 |
| JP | 2000-156097 | 6/2000 |
| JP | 2001-216780 | 8/2001 |
| JP | 2002-279784 | 9/2002 |
| JP | 2003-124318 | 4/2003 |
| KR | 1997-0063244 A | 9/1997 |

* cited by examiner

*Primary Examiner*—Huan Hoang
(74) *Attorney, Agent, or Firm*—Town and Townsend and Crew LLP

(57) ABSTRACT

An internal voltage generating circuit in a semiconductor memory device includes a comparing unit for comparing a voltage level of an internal voltage with that of a reference voltage, a pull-up driving unit for performing a pull-up operation for an output terminal in response to an output signal of the comparing unit, and a discharging unit for discharging the output terminal in a period of which the voltage level of the internal voltage is higher than a predetermined target voltage level.

15 Claims, 2 Drawing Sheets

INTERNAL VOLTAGE GENERATING CIRCUIT IN SEMICONDUCTOR MEMORY DEVICE

FIELD OF THE INVENTION

The present invention relates to a semiconductor memory device; and, more particularly, to an internal voltage generating circuit in the semiconductor memory device.

DESCRIPTION OF RELATED ART

Generally, as a semiconductor chip is highly integrated, a cell size becomes smaller and an operation voltage is also decreased. Most of semiconductor chip has an internal voltage generator for generating an internal voltage necessary for an operation of an internal circuit in the semiconductor chip. It is an important factor that the internal voltage having a stable voltage level is constantly provided.

FIG. 1 is a circuit diagram illustrating a conventional internal voltage generating circuit of a semiconductor memory device.

As shown, the internal voltage generating circuit includes a comparator 10 for comparing a voltage level of an internal voltage Vint and a reference voltage VREF, and a pull-up PMOS transistor PM1 which is connected between a power supply voltage VDD and an output terminal and whose gate receives an output signal drv_onb of the comparator 10. It is preferred that the comparator 10 is configured with a typical differential amplifier of a current mirror type.

The output signal drv_onb of a logic low level is outputted from the comparator 10 when the internal voltage Vint is lower than the reference voltage VREF by comparing the reference voltage VREF with the internal voltage Vint., so that the pull-up PMOS transistor MP1 is turned on. Therefore, the voltage level of the internal voltage Vint is increased.

On the other hand, if the voltage level of the internal voltage level Vint is increased higher than the voltage level of the reference voltage VREF, the output signal drv_onb of the comparator 10 becomes a logic high level, so that the pull-up PMOS transistor MP1 is turned off. Therefore, a rising of the voltage level of the internal voltage Vint is stopped.

The internal voltage generated from the internal voltage generating circuit is used as a source follower of the internal circuit 100. The above comparing procedure is repeated until the voltage level of the internal voltage Vint becomes the same voltage level of the reference voltage VREF after power consumption is generated by operating the internal circuit.

The power consumption of the internal circuit is increased as the semiconductor device is manufactured to have a high operation speed. Therefore, a size of a driver, i.e., the pull-up PMOS transistor MP1, in the internal voltage generating circuit should be increased to generate a stable internal voltage Vint. Also, as the operation voltage is decreased, a threshold voltage of a MOS transistor is gradually decreased.

Accordingly, there is problem that the internal voltage Vint is increased in proportion to increase of the power supply voltage VDD by a sub-threshold current produced in the pull-up PMOS transistor MP1.

Generally, the sub-threshold current (Isub) flowing in the MOS transistor is defined as a following equation 1:

$$I\text{sub} = I_o \cdot \exp[q \cdot Vgs/nkT] \quad \text{Eq. 1}$$

$$I_o = I\text{sub}_o(W/L)$$

Where q, Vgs, k and T represent a charge of an electron, a gate-source voltage, a temperature constant and an absolute temperature, respectively. Also, Isubo is a current value obtained in a process and W and L represent a width and a length of the MOS transistor.

As shown in Eq.1, the sub-threshold current is linearly proportional to the width of the MOS transistor and is exponentially proportional to the Vgs.

SUMMARY OF THE INVENTION

It is, therefore, an object of the present invention to provide an internal voltage generating circuit in a semiconductor memory device capable of suppressing a potential increase of an internal voltage due to a sub-threshold current flowing in a pull-up driver.

In accordance with an aspect of the present invention, there is provided an internal voltage generating circuit in a semiconductor memory device including: a comparing unit for comparing a voltage level of an internal voltage with that of a reference voltage; a pull-up driving unit for performing a pull-up operation for an output terminal in response to an output signal of the comparing unit; and a discharging unit for discharging the output terminal in a period of which the voltage level of the internal voltage is higher than a predetermined target voltage level.

In accordance with another aspect of the present invention, there is provided an internal voltage generating circuit in a semiconductor memory device, including: a comparing unit for comparing a voltage level of an internal voltage with that of a reference voltage; a pull-up driving unit for performing a pull-up operation for an output terminal in response to an output signal of the comparing unit; and a first discharging unit for discharging the output terminal when the voltage level of the internal voltage is higher than a predetermined target voltage level in response to the internal voltage.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, an internal voltage generating circuit in a semiconductor memory device according to the present invention will be described in detail referring to the accompanying drawings.

Figure 2:
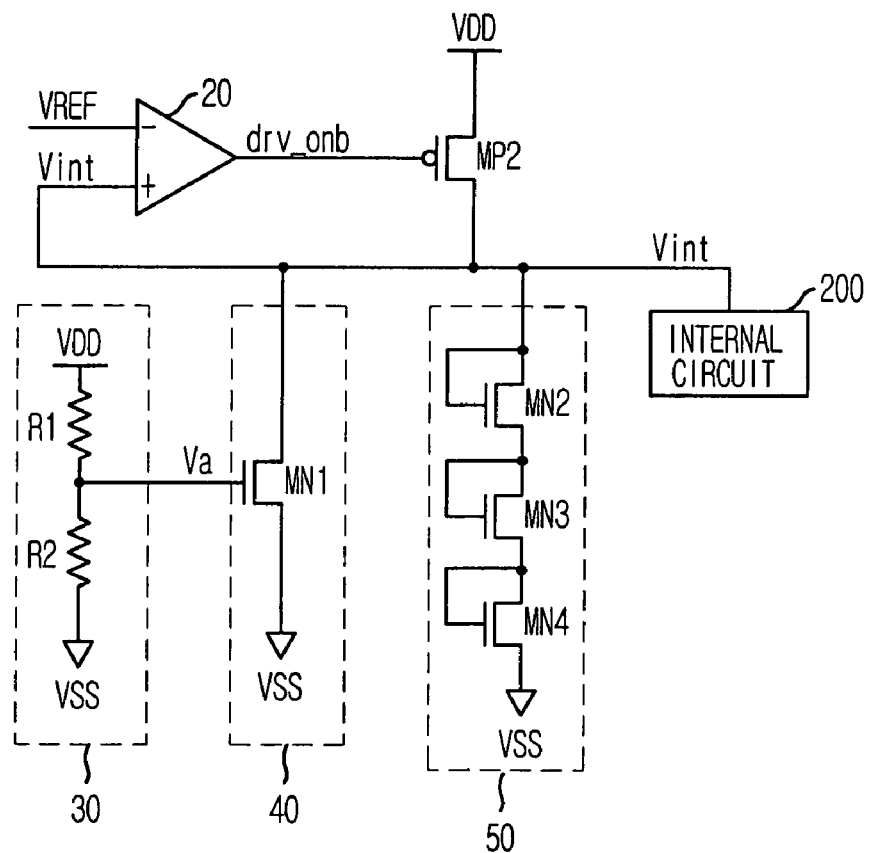
FIG. 2 is a circuit diagram illustrating an internal voltage generating circuit in accordance with the present invention.

FIG. 2 is a circuit diagram illustrating an internal-voltage generating circuit in accordance with the present invention.

The internal voltage generating circuit includes a comparator 20 for comparing a voltage level of an internal voltage level Vint and a reference voltage VREF, a pull-up PMOS transistor MP2 which is connected between a power supply voltage VDD and an output terminal and whose gate receives an output signal drv_onb of the comparator 20, and discharge units 30, 40 and 50 for discharging the output terminal at a period that a voltage level of the internal voltage Vint is higher than a predetermined target voltage level. Herein, it is preferable that the comparator 20 is configured with a typical differential amplifier of a current mirror type.

A first discharge unit 50 is to discharge the output terminal when the voltage level of the internal voltage Vint and a second discharge unit 30 and 40 is to discharge the output terminal in response to a voltage level of the power supply voltage VDD. The first discharge unit 50 includes a plurality of diode-coupled NMOS transistors MN2, MN3 and MN4, which are connected between the power supply voltage VDD and a ground voltage VSS in series. The second discharge unit includes a voltage divider 30 and a discharge driver 40. The voltage divider 30 generates a discharge control signal Va by dividing the power supply voltage VDD and the discharge driver 40 discharges the output terminal in response to the discharge control signal Va. The voltage divider 30 can be configured with a first resistor R1 and a second resistor R2 connected between the power supply voltage VDD and the ground voltage VSS in series. The discharge driver 40 includes an NMOS transistor MN1 which is connected between the output terminal and the ground voltage VSS and whose gate receives the discharge control signal Va.

Hereinafter, an operation of the internal voltage generating circuit in accordance with the preferred embodiment of the present invention will be described.

The output signal drv_onb of a logic low level is outputted from the comparator 20 when the internal voltage Vint is lower than the reference voltage VREF by comparing the reference voltage VREF with the internal voltage Vint, so that the pull-up PMOS transistor MP2 is turned on. Therefore, the voltage level of the internal voltage Vint is increased.

On the other hand, if the voltage level of the internal voltage level Vint is increased higher than the voltage level of the reference voltage VREF, the output signal drv_onb of the comparator 20 becomes a logic high level, so that the pull-up PMOS transistor MP2 is turned off. Therefore, a rising of the voltage level of the internal voltage Vint is stopped.

However, the voltage level of the internal voltage Vint is substantially increased due to a sub-threshold current flowing in a state of which the pull-up PMOS transistor MP2 is turned off. At this time, the discharge units 30, 40 and 50 are operated, so that an abnormal rising of the voltage level of the internal voltage Vint can be suppressed.

The diode-coupled NMOS transistor has characteristics that the NMOS transistor is turned on such as a diode when a voltage which is higher than the threshold voltage Vtn of the NMOS transistor is applied to a gate (or drain), and the NMOS transistor is turned off to thereby have an effective resistance corresponding to a threshold voltage when a voltage of blow threshold voltage of the NMOS transistor is applied. Accordingly, if the plurality of diode-coupled NMOS transistors are connected in series, when the voltage level on the output terminal is higher than n X Vtn, where n represents the number of NMOS transistors, all of NMOS transistors are turned on, so that the output terminal is discharged. On the other hand, if the voltage level of the internal voltage Vint is blow n X Vtn, all of NMOS transistors are turned off, so that a discharge operation from the output terminal is stopped.

Accordingly, if the number of the NMOS transistors or the threshold voltage of the NMOS transistor is adjusted to have that the n X Vtn is higher than the internal voltage level, the rising of the internal voltage Vint can be suppressed with an extra control circuit.

The discharge control signal Va is determined as following equation 2:

$$Va=(R2/(R1+R2))\times VDD \qquad \text{Eq. 2}$$

Namely, the discharge control signal Va is linearly varied according to voltage level variation of the power supply voltage VDD. The voltage level of the discharge control Va can be controlled by adjusting resistance values of resistors R1 and R2. If the discharge control signal Va is applied to the gate of the NMOS transistor MN1, a discharge operation is performed by turning on the NMOS transistor in a period of which the internal voltage Vint is increased over a target voltage level. Therefore, abnormal rising of the internal voltage Vint can be suppressed.

After fabricating the semiconductor memory device, the voltage level of the power supply voltage may be increased in a test process such as a burn-in test. At this time, the voltage level of the internal voltage is increased according to a voltage level of the power supply voltage VDD. If the NMOS transistor MN1 is designed to be operated in a saturation region by adjusting the voltage level of the discharge control signal Va, an abnormal rising of the voltage level of the internal voltage Vint can be suppressed.

Also, when the voltage level of the power supply voltage VDD is not varied such as a normal operation, if the discharge control signal Va is adjusted to perform a discharge operation as much as the sub-threshold current measured through a test, the abnormal rising of the voltage level of the internal voltage Vint can be suppressed.

Figure 1:
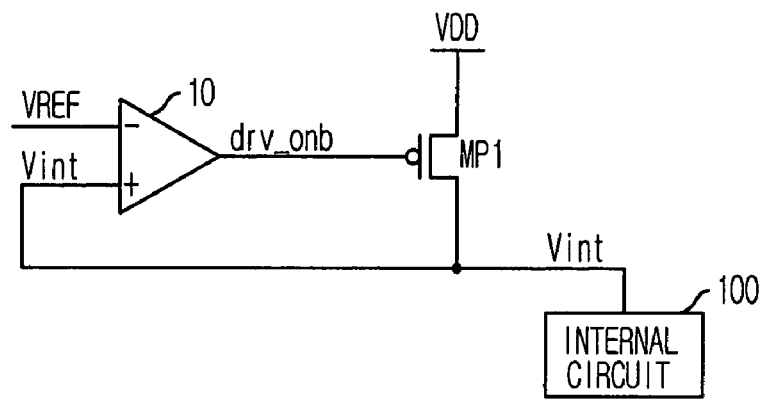
FIG. 1 is a circuit diagram illustrating a conventional internal voltage generating circuit of a semiconductor memory device.
Figure 3:
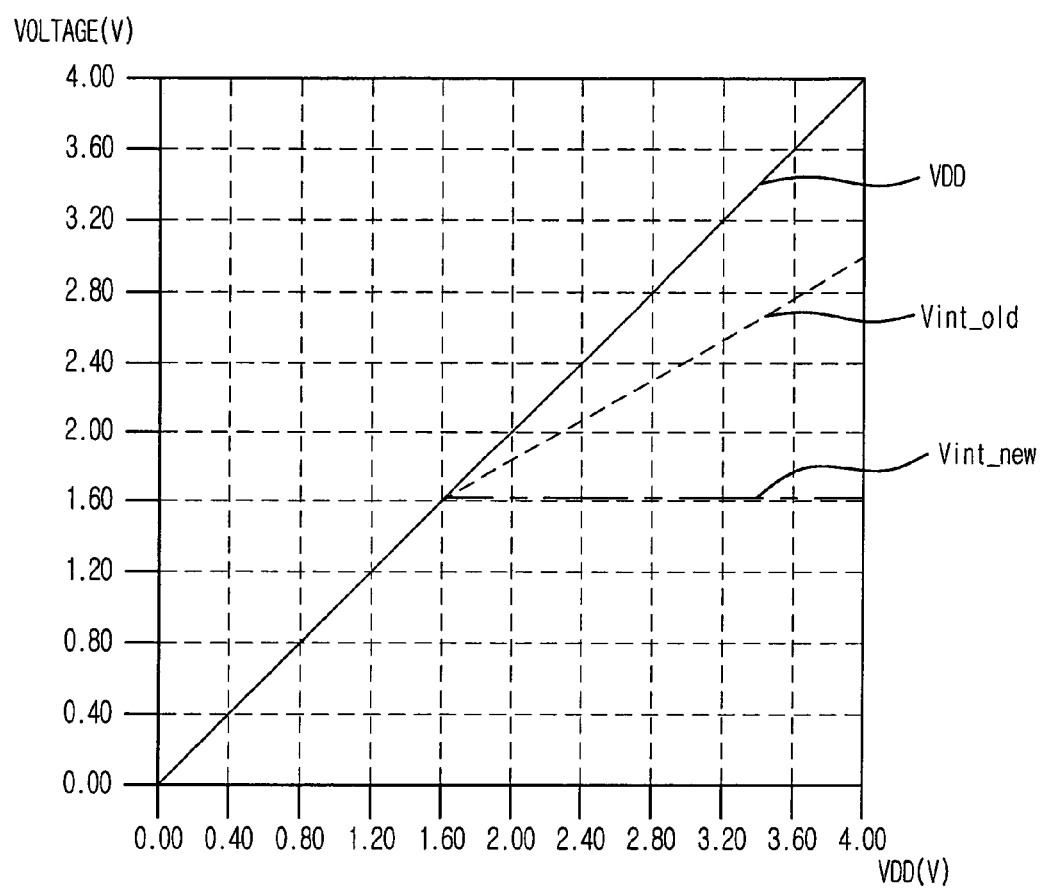
FIG. 3 is a graph showing simulation results of the internal voltage of the internal voltage generating circuit in FIGS. 1 and 2.

FIG. 3 is a graph showing simulation results of the internal voltage of the internal voltage generating circuit in FIGS. 1 and 2.

As shown, the voltage level of the internal voltage Vint_old is increased according to the prior art as the power supply voltage is increased, however, the voltage level of the internal voltage Vint_new is not increased over a target voltage, e.g., 1.6 V, in accordance with the present invention as the power supply voltage VDD is increased.

In the first discharge unit 50, even if three diode-coupled NMOS transistors are used, the number of the diode-coupled NMOS transistors can be adjusted according to a target voltage level of the internal voltage Vint and a threshold voltage of the NMOS transistor.

Also, in accordance with the preferred embodiment of the present invention of the present invention, two discharge units are used. However, one of discharge units can be used to suppress the abnormal rising of the voltage level of the internal voltage Vint.

As mentioned above, since the abnormal rising of the voltage level of the internal voltage due to the sub-threshold current flowing in the pull-up driver can be suppressed in accordance with the present invention, reliability and an operational characteristic of the semiconductor memory device can be improved.

While the present invention has been described with respect to the particular embodiments, it will be apparent to those skilled in the art that various changes and modifications may be made without departing from the spirit and scope of the invention as defined in the following claims.

What is claimed is:

1. An internal voltage generating circuit in a semiconductor memory device, comprising:
   a comparing means for comparing a voltage level of an internal voltage with that of a reference voltage;
   a pull-up driving means for performing a pull-up operation for an output terminal in response to an output signal of the comparing means; and
   a discharging means having two discharging units for discharging the output terminal in a period of which the voltage level of the internal voltage is higher than a predetermined target voltage level, wherein one of the two discharging units includes a plurality of active loads connected between the output terminal and a ground voltage in series.

2. The internal voltage generating circuit as recited in claim 1, wherein the discharge means includes:
   a first discharge unit for discharging the output terminal when the voltage level of the internal voltage is higher than the predetermined target voltage level in response to the internal voltage; and
   a second discharge unit for discharging the output terminal in response to a power supply voltage.

3. An internal voltage generating circuit in a semiconductor memory device, comprising:
   a comparing means for comparing a voltage level of an internal voltage with that of a reference voltage;
   a pull-up driving means for performing a pull-up operation for an output terminal in response to an output signal of the comparing means; and
   a first discharging means for discharging the output terminal when the voltage level of the internal voltage is higher than a predetermined target voltage level in response to the internal voltage, wherein the first discharging means includes a plurality of active loads connected between the output terminal and a ground voltage in series; and
   a second discharging means for discharging the output terminal in response to a power supply voltage.

4. The internal voltage generating circuit as recited in claim 3, wherein the first discharging means includes a plurality of diode-coupled NMOS transistors connected between the output terminal and a ground voltage in series.

5. The internal voltage generating circuit as recited in claim 3, wherein the second discharge unit includes:
   a voltage divider for producing a discharge control signal by dividing the power supply voltage; and
   a discharge driver for performing a discharge operation of the output terminal in response to the discharge control signal.

6. The internal voltage generating circuit as recited in claim 5, wherein the voltage divider includes first and second resistors connected between the power supply voltage and the ground voltage in series.

7. The internal voltage generating circuit as recited in claim 6, wherein the discharge driver includes an NMOS transistor which is connected between the output terminal and the ground voltage and whose gate receives the discharge control signal.

8. The internal voltage generating circuit as recited in claim 3, wherein the pull-up driving means includes a PMOS transistor which is connected between the power supply voltage and the output terminal and whose gate receives the output signal of the comparing means.

9. An internal voltage generating circuit in a semiconductor memory device, comprising:
   a comparing unit to compare a voltage level of an internal voltage with that of a reference voltage;
   a pull-up driving unit to perform a pull-up operation for an output terminal in response to an output signal of the comparing unit; and
   a discharging unit configured to discharge the output terminal in a period of which the voltage level of the internal voltage is higher than a predetermined target voltage level, the discharging unit including first and second discharging components,
   wherein one of the first discharging unit, the second discharging unit, and combination thereof includes a plurality of active loads provided in series between the output terminal and the ground.

10. The internal voltage generating circuit of claim 9, wherein the first discharging component includes a plurality of diode-coupled NMOS transistors provided in series between the output terminal and the ground.

11. The internal voltage generating circuit of claim 9, wherein the second discharging component is configured to discharge the output terminal in response to the power supply voltage, and the first discharging component is configured to discharge the output terminal in response to the internal voltage.

12. The internal voltage generating circuit of claim 11, wherein the second discharge component includes:
   a voltage divider to produce a discharge control signal by dividing the power supply voltage; and
   a discharge driver to perform a discharge operation of the output terminal in response to the discharge control signal.

13. The internal voltage generating circuit of claim 12, wherein the voltage divider includes first and second resistors provided in series between the power supply voltage and the ground.

14. The internal voltage generating circuit of claim 13, wherein the discharge driver includes an NMOS transistor provided between the output terminal and the ground, the NMOS transistor having a gate that is confignred to receive the discharge control signal.

15. The internal voltage generating circuit of claim 9, wherein the pull-up driving unit includes a PMOS transistor provided between the power supply voltage and the output terminal, the PMOS transistor having a gate that is configured to receive the output signal of the comparing unit.

* * * * *